US010416496B2

(12) United States Patent  
Yang et al.

(10) Patent No.: US 10,416,496 B2  
(45) Date of Patent: Sep. 17, 2019

(54) BACKLIGHT MODULE AND LIQUID CRYSTAL DISPLAY DEVICE

(71) Applicant: Wuhan China Star Optoelectronics Technology Co., Ltd., Wuhan, Hubei (CN)

(72) Inventors: Yong Yang, Guangdong (CN); Yingbao Yang, Guangdong (CN)

(73) Assignee: Wuhan China Star Optoelectronics Technology Co., Ltd, Wuhan, Hubei (CN)

(*) Notice: Subject to any disclaimer, the term of this patent is extended or adjusted under 35 U.S.C. 154(b) by 0 days.

(21) Appl. No.: 15/545,695

(22) PCT Filed: Jun. 26, 2017

(86) PCT No.: PCT/CN2017/089933  
§ 371 (c)(1),  
(2) Date: Jul. 22, 2017

(87) PCT Pub. No.: WO2018/227653  
PCT Pub. Date: Dec. 20, 2018

(65) Prior Publication Data  
US 2019/0101792 A1 Apr. 4, 2019

(30) Foreign Application Priority Data  
Jun. 12, 2017 (CN) .......................... 2017 1 0438785

(51) Int. Cl.  
*G09G 3/34* (2006.01)  
*G02F 1/1335* (2006.01)  
(Continued)

(52) U.S. Cl.  
CPC ..... *G02F 1/133603* (2013.01); *G09G 3/3406* (2013.01); *G09G 3/3426* (2013.01);  
(Continued)

(58) Field of Classification Search  
CPC ... G02F 1/133603; G02F 2001/133624; H01L 33/507; G09G 3/3607  
See application file for complete search history.

(56) References Cited

U.S. PATENT DOCUMENTS 6,541,797 B1 * 4/2003 Udagawa ................ H01L 33/06  
257/101  
8,218,866 B2 * 7/2012 Chu Ke ................... H04N 9/68  
382/167  
(Continued)

FOREIGN PATENT DOCUMENTS

CN 101788737 A 7/2010  
CN 104865746 A 8/2015  
JP 2004-078102 A 3/2004

*Primary Examiner* — Donald L Raleigh  
(74) *Attorney, Agent, or Firm* — Andrew C. Cheng

(57) ABSTRACT

A backlight module and liquid crystal display device are disclosed. The backlight module includes: at least one first light-emitting unit having a first blue light-emitting chip; at least one second light-emitting unit having a second blue light-emitting chip, wherein, an emission peak wavelength of the second blue light-emitting chip is greater than an emission peak wavelength of the first blue light-emitting chip; and a control circuit used for dynamic adjusting a brightness of the first light-emitting unit and the second light-emitting unit according to the blue saturation. The present invention can dynamically adjust the output amount of the blue light according to the blue saturation so that the present invention can selectively decrease the blue light when maintaining the display brightness and chroma.

18 Claims, 4 Drawing Sheets

(51) Int. Cl.
*G09G 3/36* (2006.01)
*H01L 33/50* (2010.01)
*H01L 25/075* (2006.01)

(52) U.S. Cl.
CPC .............. *G09G 3/36* (2013.01); *G09G 3/3607* (2013.01); *H01L 33/507* (2013.01); *G02F 2001/133614* (2013.01); *G02F 2001/133624* (2013.01); *H01L 25/0753* (2013.01)

(56) References Cited

U.S. PATENT DOCUMENTS

| | | |
|---|---|---|
| 2008/0165102 A1 | 7/2008 | Tsai et al. |
| 2009/0135337 A1* | 5/2009 | Wang ................ G02F 1/133514 349/65 |
| 2009/0207182 A1* | 8/2009 | Takada ................ G09G 3/3406 345/589 |
| 2014/0246990 A1* | 9/2014 | Kim .................. H05B 33/0866 315/250 |
| 2015/0270452 A1* | 9/2015 | Chowdhury .......... H01L 33/483 257/98 |
| 2016/0372637 A1* | 12/2016 | Huang .................... H01L 33/50 |
| 2017/0076648 A1* | 3/2017 | Lan .......................... G09G 3/36 |

* cited by examiner

BACKLIGHT MODULE AND LIQUID CRYSTAL DISPLAY DEVICE

BACKGROUND OF THE INVENTION

1. Field of the Invention

The present invention relates to a display technology field, and more particularly to a backlight module and liquid crystal display device.

2. Description of Related Art

Currently, a liquid crystal display device such as cell phone, computer and television has become an essential thing in people's life. In the liquid crystal display device, the light emitting diode has become a mainstream light source because of low heat generation and low power consumption. Wherein, a blue light-emitting chip matched with a yellow phosphor as a white light-emitting diode is the most common. In a large number of medical researches, exposing in a shortwave blue light that the wavelength is less than 460 nm for a long time will cause damage to the eyes and generate a lesion. Therefore, reducing the shortwave blue light in the liquid crystal device is beneficial to protect user's health.

In the long-term research and development, the applicant of the present invention finds that the way to decrease the shortwave blue light in the liquid crystal display device is to wear an anti-blue glass, adhere a blue filtering film on the display device, adjust a blue light ratio through a software or changing a peak of the blue light through a hardware. However, the above method will cause a loss in the brightness and a yellow color shift so as to affect the display effect.

SUMMARY OF THE INVENTION

The main technology problem solved by the present invention is to provide a backlight module and a liquid crystal display device that can selectively decrease the blue light when maintaining the display brightness and chroma.

In order to solve the above technology problem, a technology solution adopted by the present invention is a backlight module, comprising: at least one first light-emitting unit, and each first light-emitting unit includes a first blue light-emitting chip; at least one second light-emitting unit, and each second light-emitting unit includes a second blue light-emitting chip, wherein, an emission peak wavelength of the second blue light-emitting chip is greater than an emission peak wavelength of the first blue light-emitting chip; and a control circuit used for obtaining a blue saturation of a display picture of a liquid crystal panel that being provided with a backlight by the backlight module, and dynamic adjusting a brightness of the first light-emitting unit and the second light-emitting unit according to the blue saturation.

In order to solve the above technology problem, another technology solution adopted by the present invention is to provide a liquid crystal display device that includes the above backlight module.

In the present invention, through disposing light-emitting units having two different emission wavelengths in the backlight module, and dynamic adjusting output amount of the blue light according to the blue saturation. When maintaining the brightness and the chroma, low blue light can be achieve at the same time to protect eyes.

DETAILED DESCRIPTION OF THE PREFERRED EMBODIMENT

The following will combines the figures in the embodiments of the present invention to describe the technology solution of the embodiments of the present invention in detail.

Figure 1:
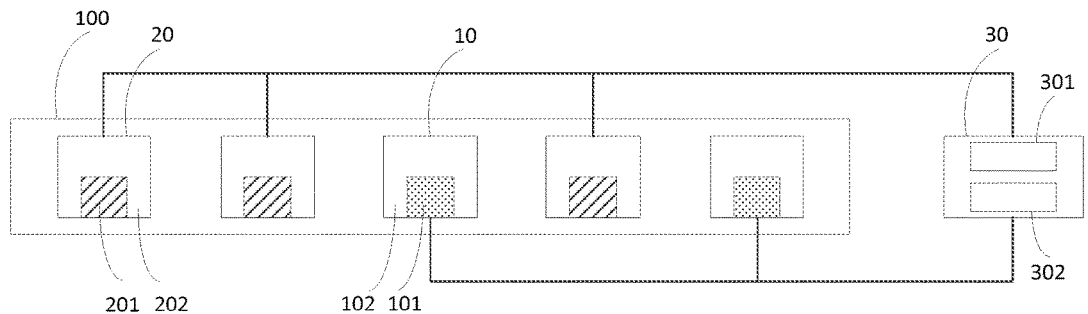
FIG. 1 is a schematic structure diagram of a backlight module according to an embodiment of the present invention.
Figure 2:
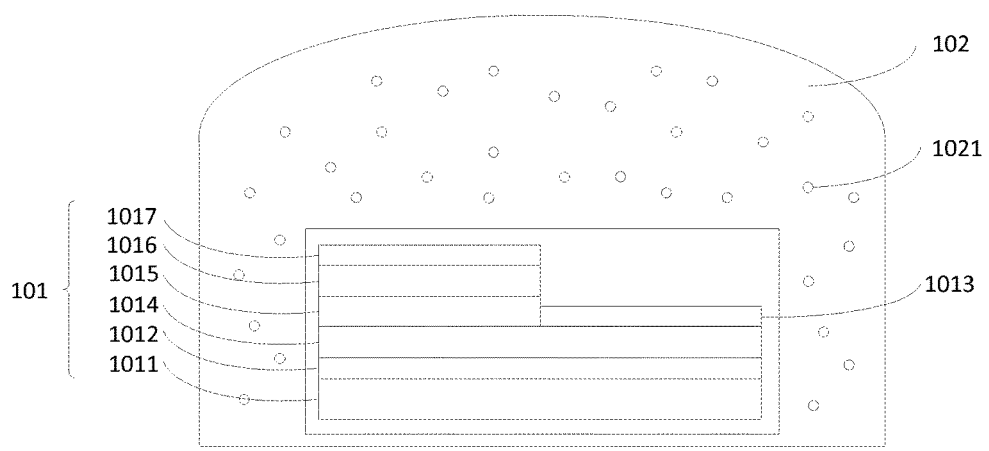
FIG. 2 is a schematic structure diagram of a first light-emitting unit of the backlight module according to another embodiment of the present invention.
Figure 3:
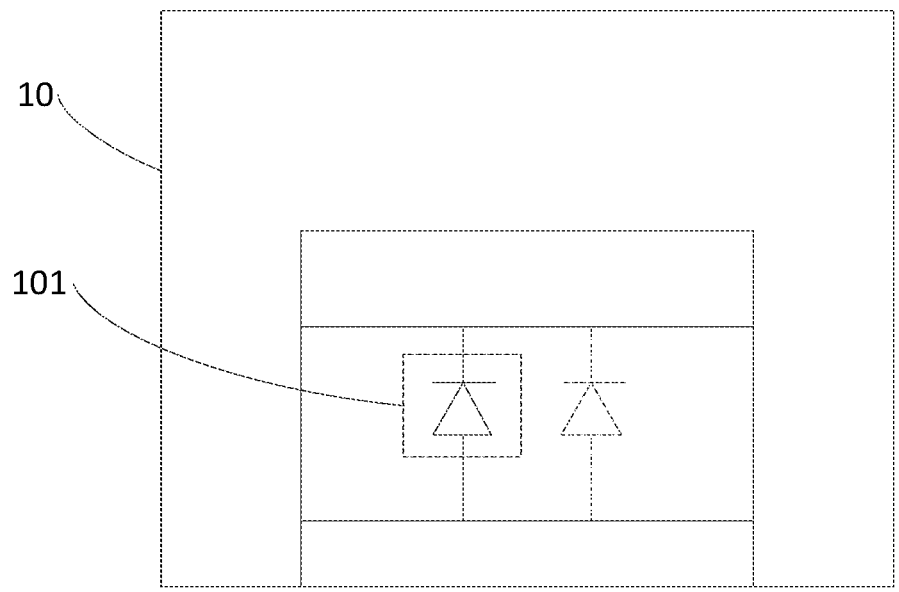
FIG. 3 is a schematic structure diagram of a first light-emitting unit of the backlight module according to another embodiment of the present invention.
Figure 4:
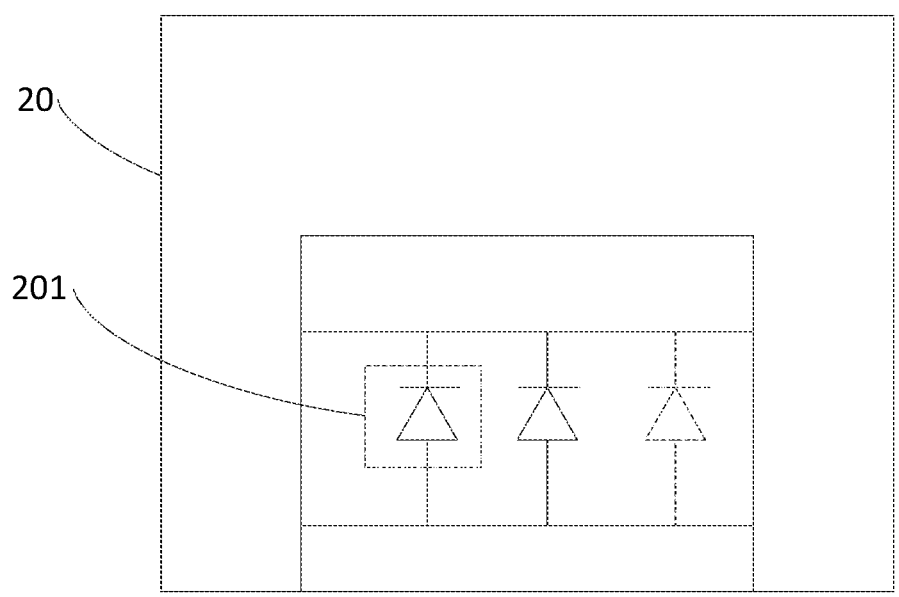
FIG. 4 is a schematic structure diagram of a second light-emitting unit of the backlight module according to another embodiment of the present invention.
Figure 5:
FIG. 5 is a schematic structure diagram of a backlight module according to another embodiment of the present invention.

With reference to FIG. 1, an embodiment of a backlight module of the present invention includes:

At least one first light-emitting unit 10 and at least one second light-emitting unit 20. Wherein, the first light-emitting unit 10 includes a first blue light-emitting chip 101. The second light-emitting unit 20 includes a second blue light-emitting chip 201. Besides, an emission peak wavelength of the second blue light-emitting chip 201 is greater than an emission peak wavelength of the first blue light-emitting chip 101.

Optionally, each of the first light-emitting unit 10 and the second light-emitting unit 20 is a package of an LED (Light Emitting Diode).

Optionally, the first light-emitting unit 10 and the second light-emitting unit 20 can emit a white light as a backlight source of a backlight module through a cooperation of fluorescent materials and the first blue light-emitting chip 101 and the second blue light-emitting chip 201. Specifically, a blue light generated by each of the first blue light-emitting chip 101 and the second blue light-emitting chip 201 excites the fluorescent material to generate an excitation light such as a green light, a red light or a yellow light. Besides, the excited light is mixed with a remaining blue light to output the white light.

In another embodiment, through a cooperation of the first blue light-emitting chip 101 and the fluorescent material, and through a cooperation of the second blue light-emitting chip 201 and the fluorescent material, the first light-emitting unit 10 and the second light-emitting unit 20 can also make at least one light-emitting unit to emit a first blue light, at least one light-emitting unit to emit a second blue light, at least one light-emitting unit to emit a green light and other light-emitting units to emit a red light in the first light-emitting unit 10 and the second light-emitting unit 20, and perform a light mixing through optical elements such as a light-guide plate and diffusion plate in order to output the white light. Or, through adding a green light-emitting chip or a red light-emitting chip in the first light emitting unit 10 and the second light-emitting unit 20 to output a white light. Or, through adding independent green light-emitting unit or red light-emitting unit to output the white light.

The control circuit 30 used for obtaining a blue saturation of a display picture of a liquid crystal panel that being provided with a backlight by the backlight module, and dynamic adjusting a brightness of the first light-emitting unit 10 and the second light-emitting unit 20 according to the blue saturation.

Optionally, the control circuit 30 can be integrated on a flexible circuit in order to facilitate for an install ion of the backlight module.

The embodiment of the present invention, through disposing light-emitting units having two different emission wavelengths in the backlight module, and dynamic adjusting output amount of the blue light according to the blue saturation. When maintaining the brightness and the chroma, low blue light can be achieve at the same time to protect eyes.

With reference to FIG. 1 to FIG. 5, another embodiment of the backlight module of the present invention includes:

At least one first light-emitting unit 10 and at least one second light-emitting unit 20. Wherein, the first light-emitting unit 10 includes a first blue light-emitting chip 101. The second light-emitting unit 20 includes a second blue light-emitting chip 201. Besides, an emission peak wavelength of the second light-emitting chip 201 is greater than an emission peak wavelength of the first light-emitting chip 101.

Optionally, the first light-emitting unit 10 and the second light-emitting unit 20 are arranged as a straight line to form a side-emitting backlight source 100, and the side-emitting backlight source 100, a reflective sheet 200, a light guide plate 300, a diffusion sheet 400 and a brightness enhancement film 500 form a backlight module.

The first light-emitting chip 101 includes a base 1011, a buffering layer 1012, a negative electrode 1013, an electron transport layer 1014, a light-emitting layer 1015, a hole transport layer 1016 and a positive electrode 1017. Under the driving of a voltage, an electron pass through the electron transport layer 1014 to the light-emitting layer 1015 from the negative electrode 1013; a hole pass through the hole transport layer 1016 to the light-emitting layer 1015 from the positive electrode 1017. The electron and the hole are interacted at the light-emitting layer 1015 in order to emit a light.

Wherein, electron transport layer is a N-type semiconductor, the light-emitting layer is an indium gallium compound, the hole transport layer is a P-type semiconductor. The structure of the second blue light-emitting chip 201 is the same as the structure of the first blue light-emitting chip 101. The difference is that a ratio of indium to gallium of the indium gallium compound in the second blue light-emitting chip 201 is greater than a ratio of indium to gallium of the indium gallium compound in the first blue light-emitting chip 101 such that a wavelength of a light emitted by the second blue light-emitting chip 201 is greater than a wavelength of a light emitted by the first blue light-emitting chip 101. Wherein, an emission peak wavelength of the first blue light-emitting chip 101 is in a range of 440 nm to 455 nm, an emission peak wavelength of the second blue light-emitting chip 201 is in a range of 460 nm to 470 nm.

Optionally, the base can be a material such as sapphire ($Al_2O_3$), silicon (Si) or silicon carbide (SiC). The N-type semiconductor can be an N-type gallium nitride (N—GaN), the indium gallium compound can be indium gallium nitride (InGaN), gallium indium phosphide (InGaP) or indium gallium arsenide (InGaAs), the P-type semiconductor can be a P-type gallium nitride (P—GaN).

The first light-emitting unit 10 further includes a fluorescent layer 102. The second light-emitting unit 20 further includes a fluorescent layer 202. Each of the fluorescent layer 102 and the fluorescent layer 202 includes a fluorescent material that can be excited by a blue light to generate another light. Optionally, the fluorescent layer 102 includes a first yellow fluorescent material, and the first yellow fluorescent material is excited by a first blue light emitted from the first blue light-emitting chip 101 in order to generate a first yellow light, and the first yellow light is mixed with a remaining portion of the first blue light to emit a first white light. Optionally, the fluorescent layer 202 includes a second yellow fluorescent material, and the second yellow fluorescent material is excited by a second blue light emitted from the second blue light-emitting chip 201 in order to generate a second yellow light, and the second yellow light is mixed with a remaining portion of the second blue light to emit a second white light. A difference between a coordinate value of a X-axis of a color coordinate of the first white color and a coordinate value of the X-axis of the color coordinate of the second white color is less than or equal to 0.015, and a difference between a coordinate value of a Y-axis of the color coordinate of the first white color and a coordinate value of the Y-axis of the color coordinate of the second white color is also less than or equal to 0.015 such that lights emitted from the first light-emitting unit 10 and the second light-emitting unit 20 will not generate a larger color shift.

Optionally, the first light-emitting unit 10 includes single first blue light-emitting chip 101 or at least two first blue light-emitting chips 101 connected in parallel, that is, a single-crystal structure, double-crystal structure or poly-crystal structure. The second light-emitting unit 20 include at least two second blue light-emitting chips connected in parallel, that is, a double-crystal structure or poly-crystal structure. A ratio of a number of the first light-emitting unit 10 to a number of the second light-emitting unit 20 is in a range of ½ to 2. Wherein, the number of the second blue light-emitting chips 201 in the second light-emitting unit 20 is greater than the number of the first blue light-emitting chips 101 in the first light-emitting unit 10.

In the present embodiment, the backlight module further includes a control circuit 30 for obtaining a blue saturation of a display picture of a liquid crystal panel that being provided with a backlight by the backlight module, and dynamic adjusting the brightness of the first light-emitting unit 10 and the second light-emitting unit 20 according to the blue saturation.

In the present embodiment, the control circuit 30 includes a first driving circuit 301 and a second driving circuit 302. The first driving circuit 301 is connected with the first light-emitting unit 10 for controlling the brightness of the first light-emitting unit 10 according to the blue saturation. The second driving circuit 302 is connected with the second light-emitting unit 20 for controlling the brightness of the second light-emitting unit 20 according to the blue saturation.

Specifically, when the blue saturation is less than or equal to a preset saturation threshold, the control circuit 30 controls the brightness of the first light-emitting unit 10 and the second light-emitting unit 20 by a first mode. Wherein, the first mode is that the control circuit 30 sets a driving current of the first light-emitting unit 10 as a saturation current of the first light-emitting unit 10, and sets a driving current of the second light-emitting unit 20 to be less than a saturation current of the second light-emitting unit 20 (such as ½ to ⅔ of the saturation current). When the blue saturation is greater than the preset saturation threshold, the control circuit 30 controls the brightness of the first light-emitting unit 10 and the second light-emitting unit 20 by a second mode. Wherein, the second mode is that the control circuit 30 turns off the first light-emitting unit 10 or sets the driving current of the first light-emitting unit 10 to be less than the saturation current of the first light-emitting unit 10, and sets the driving current of the second light-emitting unit 20 as the saturation current of the second light-emitting unit 20. Accordingly, the brightness of the first light-emitting unit 10 under the first mode is greater than the brightness of the first light-emitting unit 10 under the second mode, and the brightness of the second light-emitting unit 20 under the first mode is less than the brightness of the second light-emitting unit 210 under the second mode. In another embodiment, other methods can be used to achieve the brightness effect of the first mode and the second mode.

Furthermore, when the display picture is a white picture, the control circuit 30 controls the brightness of the first light-emitting unit 10 and the second light-emitting unit 20 through a third mode. Wherein, the third mode is that the control circuit 30 sets the driving circuits of the first light-emitting unit 10 and the second light-emitting unit 20 respectively as saturation circuits of the first light-emitting unit 10 and the second light-emitting unit 20.

Optionally, the saturation threshold can be 40%, 50% or 60%, preferably, being 50%.

Specifically, the control circuit 30 is further used for receiving a brightness of an external environment light of the backlight module in real time. When the brightness of the external environment light is greater than a preset brightness threshold, the control circuit 30 controls the brightness of the first light-emitting unit 10 and the second light-emitting unit 20 by a third mode. That is, setting the driving currents of the first light-emitting unit 10 and the second light-emitting unit 20 respectively as the saturation circuits of the first light-emitting unit 10 and the second light-emitting unit 20.

Optionally, the brightness threshold can be 1800 lux, 2000 lux or 2200 lux. Preferably, 2000 lux is selected.

In the present invention, through disposing light-emitting units having two different emission wavelengths in the backlight module, and dynamic adjusting output amount of the blue light according to the blue saturation. When maintaining the brightness and the chroma, low blue light can be achieve at the same time to protect eyes.

Figure 6:
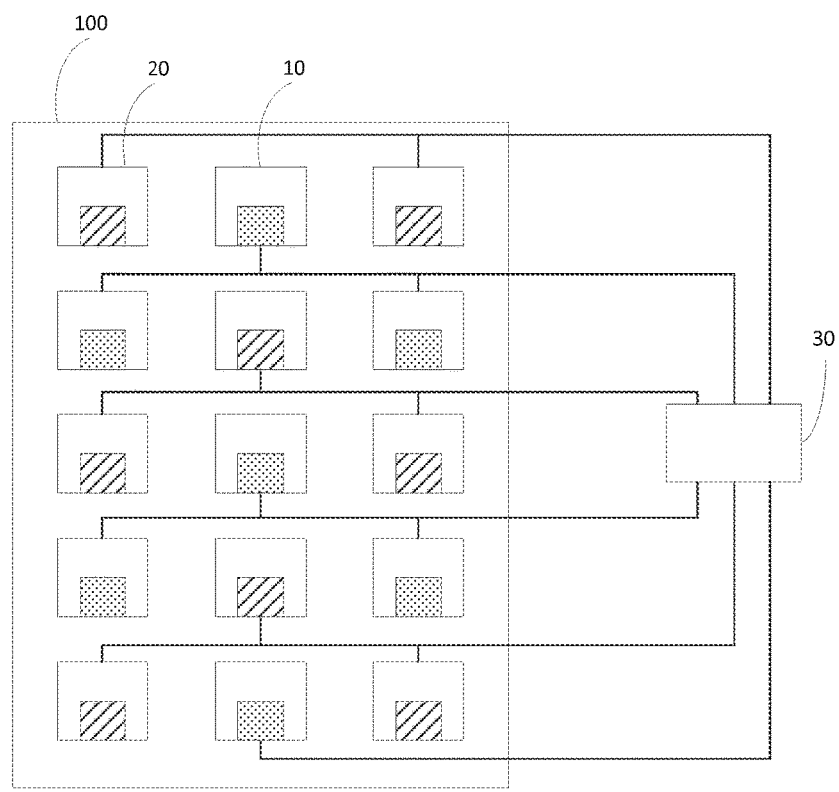
FIG. 6 is a schematic structure diagram of a backlight module according to another embodiment of the present invention.
Figure 7:
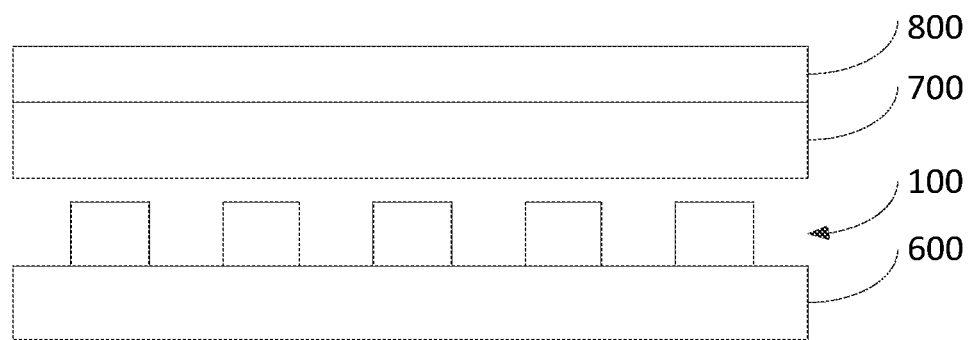
FIG. 7 is a schematic structure diagram of a backlight module according to another embodiment of the present invention.

With reference to FIG. 6 and FIG. 7, another embodiment of the backlight module of the present invention includes the at least one first light-emitting unit 10, the at least one second light-emitting unit 20 and the control circuit 30 in the embodiment of the above backlight module.

Optionally, each of the first light-emitting unit 10 and the second light-emitting unit 20 is arranged as a matrix in order to form a direct backlight source 100. Besides, the direct backlight source 100, the reflective sheet 600, the diffusion sheet 700 and the brightness enhancement film 800 form the backlight module.

In the present invention, through disposing light-emitting units having two different emission wavelengths in the backlight module, and dynamic adjusting output amount of the blue light according to the blue saturation. Besides, a light-guide plate is omitted to reduce a thickness of the backlight module and the backlight loss such that the emitting surface is more even. When maintaining the brightness and the chroma, low blue light can be achieve at the same time to protect eyes.

Figure 8:
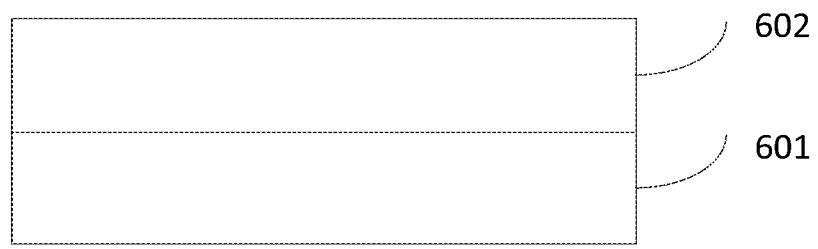
FIG. 8 is a schematic structure diagram of a liquid crystal display device according to an embodiment of the present invention.

With reference to FIG. 8, an embodiment of the liquid crystal display device of the present invention includes a backlight module 601 and a display panel 602 disposed above the backlight module 601.

In the present invention, through disposing light-emitting units having two different emission wavelengths in the backlight module, and dynamic adjusting output amount of the blue light according to the blue saturation. When maintaining the brightness and the chroma, low blue light can be achieve at the same time to protect eyes.

The above embodiments of the present invention are not used to limit the claims of this invention. Any use of the content in the specification or in the drawings of the present invention which produces equivalent structures or equivalent processes, or directly or indirectly used in other related technical fields is still covered by the claims in the present invention.

What is claimed is:

1. A backlight module, comprising:
   at least one first light-emitting unit, and each first light-emitting unit includes a first blue light-emitting chip;
   at least one second light-emitting unit, and each second light-emitting unit includes a second blue light-emitting chip, wherein an emission peak wavelength of the second blue light-emitting chip is greater than an emission peak wavelength of the first blue light-emitting chip;
   a control circuit used for obtaining a blue saturation of a display picture of a liquid crystal panel that being provided with a backlight by the backlight module, and dynamic adjusting a brightness of the first light-emitting unit and the second light-emitting unit according to the blue saturation;
   wherein the emission peak wavelength of the first blue light-emitting chip is in a range of 440 nm to 455 nm, the emission peak wavelength of the second blue light-emitting chip is in a range of 460 nm to 470 nm;
   wherein when the blue saturation is less than or equal to a preset saturation threshold, the control circuit controls the brightness of the first light-emitting unit and the second light-emitting unit by a first mode; when the blue saturation is greater than the preset saturation threshold, the control circuit controls the brightness of the first light-emitting unit and the second light-emitting unit by a second mode; wherein the brightness of the first light-emitting unit under the first mode is greater than the brightness of the first light-emitting unit under the second mode, and the brightness of the second light-emitting unit under the first mode is less than the brightness of the second light-emitting unit under the second mode.

2. The backlight module according to claim 1, wherein under the first mode, the control circuit sets a driving current of the first light-emitting unit as a saturation current of the first light-emitting unit, and sets a driving current of the second light-emitting unit to be less than a saturation current of the second light-emitting unit; under the second mode, the control circuit turns off the first light-emitting unit or sets the driving current of the first light-emitting unit to be less than the saturation current of the first light-emitting unit, and sets the driving current of the second light-emitting unit as the saturation current of the second light-emitting unit.

3. The backlight module according to claim 1, wherein when the display picture is a white picture or a brightness of an external environment light of the backlight module is greater than a preset brightness threshold, the control circuit controls the brightness of the first light-emitting unit and the second light-emitting unit by a third mode; under the third mode, the control circuit sets the driving currents of the first light-emitting unit and the second light-emitting unit respectively as the saturation circuits of the first light-emitting unit and the second light-emitting unit.

4. A backlight module, comprising:
at least one first light-emitting unit, and each first light-emitting unit includes a first blue light-emitting chip;
at least one second light-emitting unit, and each second light-emitting unit includes a second blue light-emitting chip, wherein an emission peak wavelength of the second blue light-emitting chip is greater than an emission peak wavelength of the first blue light-emitting chip; and
a control circuit used for obtaining a blue saturation of a display picture of a liquid crystal panel that being provided with a backlight by the backlight module, and dynamic adjusting a brightness of the first light-emitting unit and the second light-emitting unit according to the blue saturation;
wherein when the blue saturation is less than or equal to a preset saturation threshold, the control circuit controls the brightness of the first light-emitting unit and the second light-emitting unit by a first mode; when the blue saturation is greater than the preset saturation threshold, the control circuit controls the brightness of the first light-emitting unit and the second light-emitting unit by a second mode; wherein the brightness of the first light-emitting unit under the first mode is greater than the brightness of the first light-emitting unit under the second mode, and the brightness of the second light-emitting unit under the first mode is less than the brightness of the second light-emitting unit under the second mode.

5. The backlight module according to claim 4, wherein a light-emitting layer of each of the first blue light-emitting chip and the second blue light-emitting chip includes an indium gallium compound, wherein a ratio of indium to gallium of the indium gallium compound in the second blue light-emitting chip is greater than a ratio of indium to gallium of the indium gallium compound in the first blue light-emitting chip.

6. The backlight module according to claim 4, wherein the first light-emitting unit includes single first blue light-emitting chip or at least two first blue light-emitting chips connected in parallel; the second light-emitting unit include at least two second blue light-emitting chips connected in parallel, wherein the number of the second blue light-emitting chips in the second light-emitting unit is greater than the number of the first blue light-emitting chips in the first light-emitting unit.

7. The backlight module according to claim 4, wherein the emission peak wavelength of the first blue light-emitting chip is in a range of 440 nm to 455 nm, the emission peak wavelength of the second blue light-emitting chip is in a range of 460 nm to 470 nm.

8. The backlight module according to claim 4, wherein the first light-emitting unit and the second light-emitting unit respectively include fluorescent materials that can be excited by the first blue light-emitting chip and the second blue light-emitting chip such that each of the first light-emitting unit and the second light-emitting unit can emit a white light, and a difference between a coordinate value of a X-axis of a color coordinate of the white color emitted by the first light-emitting unit and a coordinate value of the X-axis of the color coordinate of the white color emitted by the second light-emitting unit is less than or equal to 0.015, and a difference between a coordinate value of a Y-axis of the color coordinate of the white color emitted by the first light-emitting unit and a coordinate value of the Y-axis of the color coordinate of the white color emitted by the second light-emitting unit is also less than or equal to 0.015.

9. The backlight module according to claim 4, wherein the control circuit includes a first driving circuit and a second driving circuit; the first driving circuit is used for controlling the brightness of the first light-emitting unit according to the blue saturation; the second driving circuit is used for controlling the brightness of the second light-emitting unit according to the blue saturation.

10. The backlight module according to claim 4, wherein under the first mode, the control circuit sets a driving current of the first light-emitting unit as a saturation current of the first light-emitting unit, and sets a driving current of the second light-emitting unit to be less than a saturation current of the second light-emitting unit; under the second mode, the control circuit turns off the first light-emitting unit or sets the driving current of the first light-emitting unit to be less than the saturation current of the first light-emitting unit, and sets the driving current of the second light-emitting unit as the saturation current of the second light-emitting unit.

11. The backlight module according to claim 4, wherein when the display picture is a white picture or a brightness of an external environment light of the backlight module is greater than a preset brightness threshold, the control circuit controls the brightness of the first light-emitting unit and the second light-emitting unit by a third mode; under the third mode, the control circuit sets the driving currents of the first light-emitting unit and the second light-emitting unit respectively as the saturation circuits of the first light-emitting unit and the second light-emitting unit.

12. A liquid crystal display device, comprising a backlight module, and the backlight module comprises:
at least one first light-emitting unit, and each first light-emitting unit includes a first blue light-emitting chip;
at least one second light-emitting unit, and each second light-emitting unit includes a second blue light-emitting chip, wherein an emission peak wavelength of the second blue light-emitting chip is greater than an emission peak wavelength of the first blue light-emitting chip; and
a control circuit used for obtaining a blue saturation of a display picture of a liquid crystal panel that being provided with a backlight by the backlight module, and dynamic adjusting a brightness of the first light-emitting unit and the second light-emitting unit according to the blue saturation;
wherein when the blue saturation is less than or equal to a preset saturation threshold, the control circuit controls the brightness of the first light-emitting unit and the second light-emitting unit by a first mode; when the blue saturation is greater than the preset saturation threshold, the control circuit controls the brightness of the first light-emitting unit and the second light-emitting unit by a second mode; wherein the brightness of the first light-emitting unit under the first mode is greater than the brightness of the first light-emitting unit under the second mode, and the brightness of the second light-emitting unit under the first mode is less than the brightness of the second light-emitting unit under the second mode.

13. The liquid crystal display device according to claim 12, wherein
a light-emitting layer of each of the first blue light-emitting chip and the second blue light-emitting chip includes an indium gallium compound, wherein a ratio of indium to gallium of the indium gallium compound in the second blue light-emitting chip is greater than a ratio of indium to gallium of the indium gallium compound in the first blue light-emitting chip.

14. The liquid crystal display device according to claim 12, wherein
the emission peak wavelength of the first blue light-emitting chip is in a range of 440 nm to 455 nm, the emission peak wavelength of the second blue light-emitting chip is in a range of 460 nm to 470 nm.

15. The liquid crystal display device according to claim 12, wherein
the first light-emitting unit and the second light-emitting unit respectively include fluorescent materials that can be excited by the first blue light-emitting chip and the second blue light-emitting chip such that each of the first light-emitting unit and the second light-emitting unit can emit a white light, and a difference between a coordinate value of a X-axis of a color coordinate of the white color emitted by the first light-emitting unit and a coordinate value of the X-axis of the color coordinate of the white color emitted by the second light-emitting unit is less than or equal to 0.015, and a difference between a coordinate value of a Y-axis of the color coordinate of the white color emitted by the first light-emitting unit and a coordinate value of the Y-axis of the color coordinate of the white color emitted by the second light-emitting unit is also less than or equal to 0.015.

16. The liquid crystal display device according to claim 12, wherein
the control circuit includes a first driving circuit and a second driving circuit; the first driving circuit is used for controlling the brightness of the first light-emitting unit according to the blue saturation; the second driving circuit is used for controlling the brightness of the second light-emitting unit according to the blue saturation.

17. The liquid crystal display device according to claim 12, wherein
under the first mode, the control circuit sets a driving current of the first light-emitting unit as a saturation current of the first light-emitting unit, and sets a driving current of the second light-emitting unit to be less than a saturation current of the second light-emitting unit; under the second mode, the control circuit turns off the first light-emitting unit or sets the driving current of the first light-emitting unit to be less than the saturation current of the first light-emitting unit, and sets the driving current of the second light-emitting unit as the saturation current of the second light-emitting unit.

18. The liquid crystal display device according to claim 12, wherein
when the display picture is a white picture or a brightness of an external environment light of the backlight module is greater than a preset brightness threshold, the control circuit controls the brightness of the first light-emitting unit and the second light-emitting unit by a third mode; under the third mode, the control circuit sets the driving currents of the first light-emitting unit and the second light-emitting unit respectively as the saturation circuits of the first light-emitting unit and the second light-emitting unit.

* * * * *